(12) United States Patent
Motoyui

(10) Patent No.: US 7,609,103 B2
(45) Date of Patent: Oct. 27, 2009

(54) DELAY CIRCUIT WITH REFERENCE PULSE GENERATOR TO REDUCE VARIATION IN DELAY TIME

(75) Inventor: Toshiaki Motoyui, Shiga (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/132,870

(22) Filed: Jun. 4, 2008

(65) Prior Publication Data
US 2008/0303571 A1 Dec. 11, 2008

(30) Foreign Application Priority Data
Jun. 5, 2007 (JP) ............................. 2007-149125

(51) Int. Cl.
*H03H 11/26* (2006.01)
(52) U.S. Cl. ..................... 327/261; 327/263; 327/265
(58) Field of Classification Search ................. None
See application file for complete search history.

(56) References Cited

U.S. PATENT DOCUMENTS 7,253,672 B2 * 8/2007 Gomm et al. ............... 327/261

* cited by examiner

*Primary Examiner*—An T Luu
(74) *Attorney, Agent, or Firm*—Foley & Lardner LLP

(57) ABSTRACT

A delay circuit to generate and output a delayed signal delayed from an input signal includes a reference pulse generating circuit to generate a reference pulse train in response to the input of the input signal, the reference pulse generating circuit having a feedback circuit containing a delay portion to determine a time interval between the reference pulses, a counter to output count signals based on a reference clock, the counter receiving the reference pulse train generated by the reference pulse generating circuit as the reference clock, and a delayed signal output circuit to generate and output the delayed signal based on the input signal and the count signals.

20 Claims, 8 Drawing Sheets

DELAY CIRCUIT WITH REFERENCE PULSE GENERATOR TO REDUCE VARIATION IN DELAY TIME

BACKGROUND OF THE INVENTION

1. Field of the Invention

The present invention relates to a delay circuit, in particular, a delay circuit to prevent current from flowing through a driver circuit.

2. Description of Related Art

A driver circuit to drive a load such as a motor is conventionally equipped with a delay circuit to prevent current from flowing through the driver circuit. FIG. 4 shows a driver circuit 400 in related art. The driver circuit 400 includes a through current prevention circuit 401 composed of delay circuits 402a and 402b and inverters INV1 and INV2, and CMOS transistors (a PMOS transistor P1 and a NMOS transistor N1). The CMOS transistors are connected to the through current prevention circuit 401, and connected between power supply potential and ground potential. Furthermore, a load such as motor (not shown) is connected to the output OUT of the CMOS transistors.

The delay circuit 402a outputs a delayed signal, the rising edge of which is delayed from the rising edge of the input signal IN supplied through the inverter INV1 (see output of delay circuit 402a in FIG. 5). Furthermore, the delay circuit 402b outputs a delayed signal, the rising edge of which is delayed from the rising edge of the input signal IN (see output of delay circuit 402b in FIG. 5). When the first delayed signal in "High" level, which is outputted from the inverter INV2, is inputted to the gate of the PMOS transistor P1, the PMOS transistor P1 becomes the off-state. Meanwhile, the second delayed signal in "Low" level is inputted to the gate of the NMOS transistor N1, the NMOS transistor N1 is in the off-state. That is, the driver circuit 400 creates the situation where both of the PMOS transistor P1 and NMOS transistor N1 become the off-state at the same time by the delay circuits 402a and 402b (see t1-t2 and t3-t4 in FIG. 5), and thereby preventing through current from the power supply potential VDD to the ground potential, which may otherwise occur when both of the PMOS transistor P1 and NMOS transistor N1 become the on-state at the same time.

FIG. 6 shows internal structure of a delay circuit 402 in the related art. The delay circuit 402 is composed of a plurality of rising edge delay circuits 403 connected with one another. Each of the rising edge delay circuits 403 creates desired delay time by, for example, connecting several invertors, each of which is composed of a PMOS transistor and a NMOS transistor (see FIG. 7).

Japanese Unexamined Patent Publication No. 10-13207 discloses a delay circuit (through current prevention circuit) to generate desired delay time by controlling the operations of several flip-flop circuits connected with one another based on a clock signal supplied to an external clock input terminal CK (see FIG. 8).

However, in the delay circuit in FIG. 6, for example, there may be variations (or deviations from the desired value) in the final delay time among the devices. That is, transistors in the plurality of rising edge delay circuits 403a-403n may have process variations caused in the manufacturing process. Consequently, the rising edge delay circuits 403 may have variations in their delay times among each other. Therefore, delay circuits in the related art have variations (or deviations from the desired value) in the final delay time.

SUMMARY

In one embodiment, a delay circuit to generate and output a delayed signal delayed from an input signal includes: a reference pulse generating circuit to generate a reference pulse train in response to the input of the input signal, the reference pulse generating circuit having a feedback circuit containing a delay portion to determine a time interval between the reference pulses; a counter to output count signals based on a reference clock, the counter receiving the reference pulse train generated by the reference pulse generating circuit as the reference clock; and a delayed signal output circuit to generate and output the delayed signal based on the input signal and the count signals.

In accordance with one embodiment of the present invention, a reference pulse train generated by the reference pulse generating circuit including the delay portion which determines a time interval between the reference pulses is inputted to the counter as the reference clock, so that the delay circuit can generate and output a delayed signal based on the input signal and the count signals.

In accordance with one aspect, the present invention provides a delay circuit capable of reducing variations in delay time.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
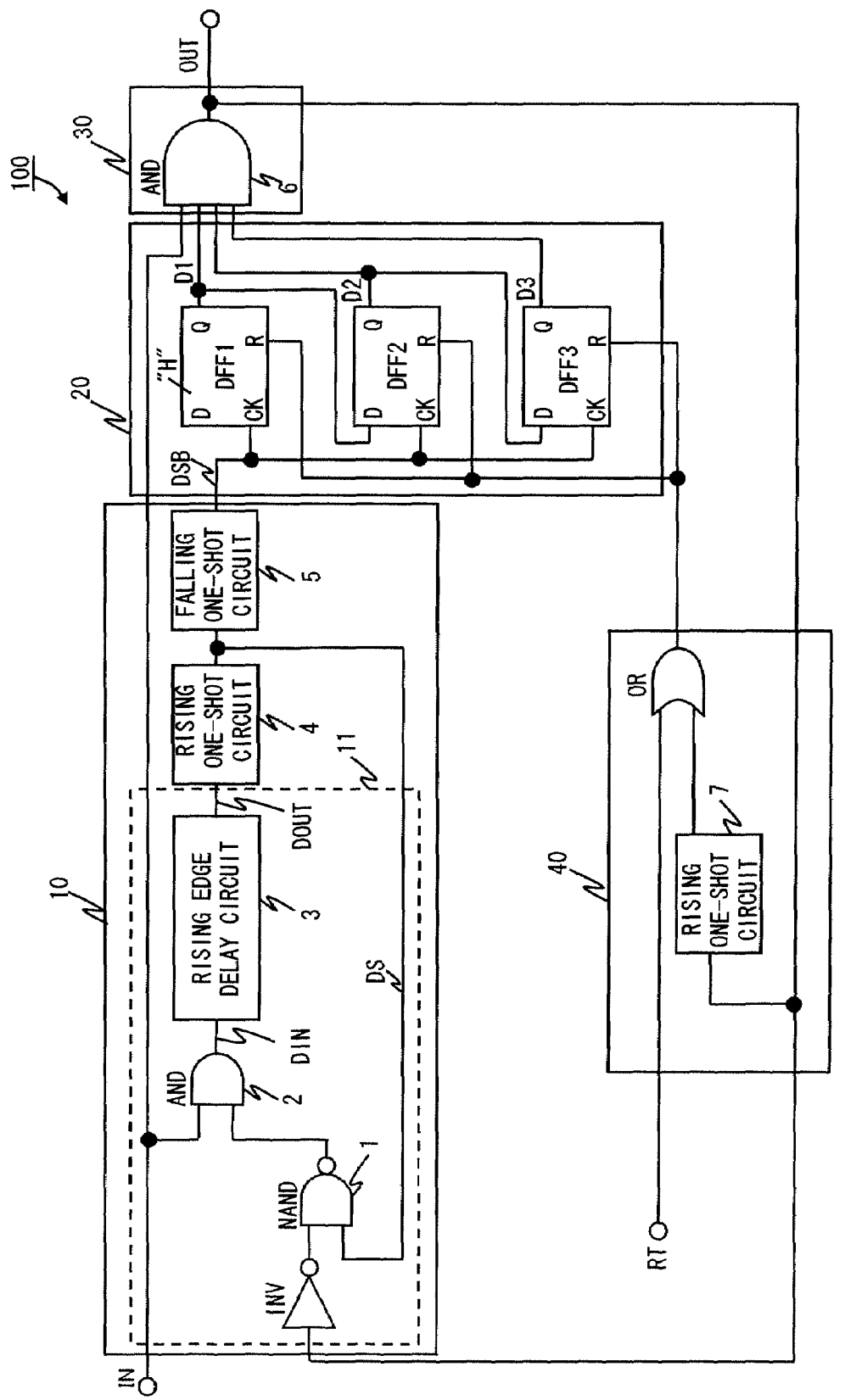
FIG. 1 is a block diagram showing a delay circuit in accordance with a first embodiment of the present invention.

Embodiments of the present invention are explained hereinafter with reference to the drawings. FIG. 1 is a block diagram showing a delay circuit 100 in accordance with a first embodiment of the present invention. As shown in FIG. 1, the delay circuit 100 in accordance with this embodiment includes a reference pulse generating circuit 10, a counter 20, a delayed signal output circuit 30, and a reset signal output circuit 40.

The reference pulse generating circuit 10 has a feedback circuit 11 containing a delay portion which determines a time interval between reference pulses, and generates a reference pulse train in response to an input signal. The feedback circuit 11 carries out a calculation using a signal based on a delayed pulse train which is generated in the delay portion in the process for generating the reference pulse, a signal generated based on a delayed signal outputted from a delayed signal output circuit 30 (which is explained later), and the input signal, and supplies the calculation result to the delay portion. The counter 20 receives the reference pulse train generated by the reference pulse generating circuit 10 as a reference clock, and outputs count signals based on this reference clock. The delayed signal output circuit 30 generates and outputs a delayed signal based on the input signal and the count signals outputted from the counter 20. The reset signal output circuit 40 outputs a reset signal, which is generated based on the delayed signal outputted from the delayed signal output circuit 30, to the counter 20. The detail of each block is explained hereinafter with reference to FIG. 1.

The reference pulse generating circuit 10 has a feedback circuit 11, a rising one-shot circuit 4, and a falling one-shot circuit 5. Furthermore, the feedback circuit 11 is composed of an inverter INV, a NAND circuit 1, a calculation circuit (which is called "AND circuit" hereinafter) 2, and a delay portion (which is called "rising edge delay circuit" hereinafter) 3.

The inverter INV inverts the level of a delayed signal OUT outputted from the delayed signal output circuit 30 (which is explained later), and outputs the resulting signal to the NAND circuit 1. The NAND circuit 1 calculates and outputs an inverted logical product of a signal DS outputted from the rising one-shot circuit 4 and the inverted delayed signal OUT from the inverter INV. The calculation circuit 2 calculates a logical product of the input signal IN and the signal outputted from the NAND circuit 1, and outputs the resulting signal as an input pulse train (which is called "signal DIN" hereinafter). The rising edge delay circuit 3 generates and outputs a delayed pulse train (which is called "signal DOUT" hereinafter), the rising edge of which is delayed from the rising edge of the signal DIN outputted from the calculation circuit 2.

The rising one-shot circuit 4 generates the signal DS which rises in synchronization with the rising edge of the signal DOUT outputted from the rising edge delay circuit 3, and has a predetermined pulse width. This signal DS is inputted to the NAND circuit 1 and a falling one-shot circuit 5. The falling one-shot circuit 5 generates the signal DSB which rises in synchronization with the falling edge of the signal DS, and has a predetermined pulse width.

Incidentally, although the signal DS generated by the rising one-shot circuit 4 is inputted to the NAND circuit 1 in this embodiment, the signal DOUT generated by the rising edge delay circuit 3 or the signal DSB may be inputted to the NAND circuit 1, instead of the signal DS, in other embodiments. Furthermore, the signal DSB which corresponds to the reference pulse train generated by the falling one-shot circuit 5 is inputted to the counter 20 (which is explained later) as the reference clock in this embodiment, the signal DOUT generated by the rising edge delay circuit 3 or the signal DS generated by the rising one-shot circuit 4 may be inputted to the counter 20 as the reference clock, instead of the signal DSB, in other embodiments.

The counter 20 has D-type flip-flop circuits DFF1-DFF3. The D-type flip-flop circuits output the same values as the input values being inputted at the time when the signal DSB outputted from the falling one-shot circuit 5 is inputted as the reference clock. The signal DSB generated by the falling one-shot circuit 5 is inputted to each clock input terminal CK of the D-type flip-flop circuits DFF1-DFF3 (which are called simply "DFF circuits" hereinafter). A "High" level signal is continuously supplied to the input D of the DFF circuit DFF1. Furthermore, the output Q of the DFF circuit DFF1 is connected to the input D of the DFF circuit DFF2, and the output Q of the DFF circuit DFF2 is connected to the input D of the DFF circuit DFF3. Furthermore, count signals D1-D3 are outputted from respective outputs of the DFF circuits DFF1-DFF3, and inputted to the delayed signal output circuit 30 (which is explained later). Furthermore, the output (which is explained later) of the reset signal output circuit 40 is connected to each reset R of the DFF circuits DFF1-DFF3.

The delayed signal output circuit 30 is composed of an AND circuit 6. The AND circuit 6 calculates a logical product of the input signal IN and the count signals D1-D3 outputted from the DFF circuits DFF1-DFF3, and outputs the resulting signal as the delayed signal OUT.

The reset signal output circuit 40 has a falling one-shot circuit 7 and an OR circuit OR. The falling one-shot circuit 7 outputs a pulse signal, which rises in synchronization with the falling edge of the signal outputted from the AND circuit 6 and has a predetermined pulse width, to the OR circuit OR. The OR circuit OR calculates the logical sum of a signal supplied at the reset terminal RT and the signal outputted from the falling one-shot circuit 7, and outputs the resulting signal to the resets Rs of the DFF circuits DFF1-DFF3 as a reset signal.

Figure 2:
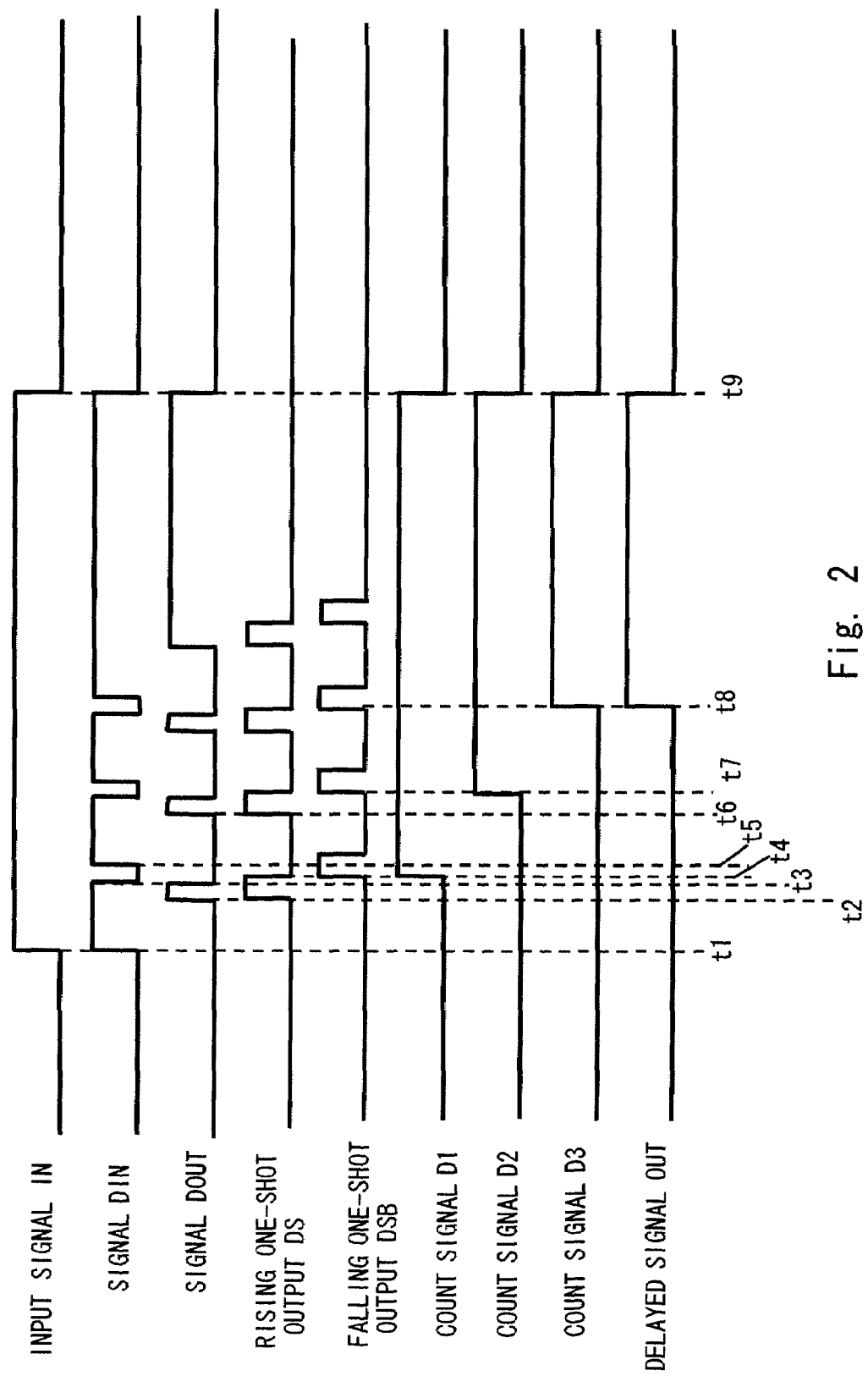
FIG. 2 is a timing chart showing waveforms at various points in the delay circuit in accordance with the first embodiment of the present invention.

FIG. 2 is a timing chart showing waveforms at various points in the delay circuit 100 shown in FIG. 1. The operation of the delay circuit 100 in accordance with this embodiment is explained in detail hereinafter with reference to FIGS. 1 and 2.

Firstly, the operation of the reference pulse generating circuit 10 is explained hereinafter. As the delay circuit 100 starts the operation, "High" level signal from the inverter INV which inverts the delayed signal OUT in "Low" level to "High" level, and the signal DS in "Low" level outputted from the rising one-shot circuit 4 are inputted to the NAND circuit 1. Consequently, the NAND circuit 1 outputs "High" level signal. Therefore, when the input signal IN in "High" level is inputted to the calculation circuit 2, the calculation circuit 2 outputs the signal DIN in "High" level to the rising edge delay circuit 3 (see t1 in FIG. 2).

The rising edge delay circuit 3 outputs the signal DOUT, the rising edge of which is delayed from the rising edge of the inputted signal DIN (see t2 in FIG. 2). The amount of this delay determines the time interval between the reference pulses generated by the rising edge delay circuit 3. The signal DOUT in "High" level is inputted to the rising one-shot circuit 4. The rising one-shot circuit 4 generates the signal DS which rises in synchronization with the rising edge of the signal DOUT outputted from the rising edge delay circuit 3 (see t2 in FIG. 2).

The signal DS in "High" level is inputted to the NAND circuit 1. That is, this signal DS in "High" level and the inverted delayed signal OUT, which is inverted to "High" level through the inverter INV, are inputted to the NAND circuit 1. Consequently, the NAND circuit 1 outputs "Low" level signal to the calculation circuit 2. Therefore, the signal DIN becomes "Low" level after the delay caused by the inherent circuit delays of the NAND circuit 1 and calculation circuit 2 from the rising edge of the signal DS (see t2 and t3 in FIG. 2). Then, the signal DOUT outputted from the rising edge delay circuit 3 falls in synchronization with the inputted signal DIN in "Low" level (see t3 in FIG. 2).

Then, the signal DS in "High" level becomes "Low" level after the predetermined time period (see t4 in FIG. 2). This signal DS in "Low" level is inputted to the NAND circuit 1. That is, this signal DS in "Low" level and the inverted delayed signal OUT, which is inverted to "High" level through the inverter INV, are inputted to the NAND circuit 1. Consequently, the NAND circuit 1 outputs "High" level signal to the calculation circuit 2. Therefore, the calculation circuit 2 outputs the signal DIN in "High" level after the delay caused by the inherent circuit delays of the NAND circuit 1 and calculation circuit 2 from the falling edge of the signal DS (see t5 in FIG. 2). Then, as the signal DIN in "High" level is inputted to the rising edge delay circuit 3, the rising edge delay circuit 3 outputs the signal DOUT, the rising edge of which is delayed from the rising edge of the inputted signal DIN (see t6 in FIG. 2). The rising one-shot circuit 4 generates the signal DS which rises in synchronization with the rising edge of the delayed signal DOUT.

The falling one-shot circuit 5 outputs the signal DSB which rises in synchronization with the falling edge of the signal DS generated by the rising one-shot circuit 4 and falls after the predetermined time period. As explained above, the signal DSB generated by the falling one-shot circuit 5 is inputted to each clock input terminal CK of the DFF circuits DFF1-DFF3 as the reference clock.

The reference pulse generating circuit 10 can generates the reference pulse train by repeating these actions. Furthermore, the interval between the reference pulses is determined by the rising edge delay circuit 3. That is, the larger the delay amount in the signal DOUT generated by the rising edge delay circuit 3 from the signal DIN, the longer the interval becomes between the reference pulses. As the interval between the reference pulses becomes larger, the delay circuit 100 can outputs the delayed signal OUT which has larger delay from the input signal IN, because the output timing of the count signals outputted from the counter (which is explained later) are delayed.

Next, the operation of the counter 20 is explained hereinafter. A "High" level signal is continuously supplied to the input D of the DFF circuit DFF1. Therefore, when the signal DSB outputted from the falling one-shot circuit 5 is inputted to the clock input terminal CK, the DFF circuit DFF1 outputs the count signal D1 in "High" level from the output Q (see t4 in FIG. 2). The count signal D1 in "High" level is inputted to the input D of the DFF circuit DFF2. Therefore, when the signal DSB is inputted to the clock input terminal CK, the DFF circuit DFF2 outputs the count signal D2 in "High" level from the output Q (see t7 in FIG. 2).

The count signal D2 in "High" level is inputted to the input D of the DFF circuit DFF3. Therefore, when the signal DSB is inputted to the clock input terminal CK, the DFF circuit DFF3 outputs the count signal D3 in "High" level from the output Q (see t8 in FIG. 2).

Next, the operation of the delayed signal output circuit 30 is explained hereinafter. The count signals D1-D3 outputted from the DFF circuits DFF1-DFF3 are inputted to the AND circuit 6. That is, the input signal IN and the count signals D1-D3 are inputted to the AND circuit 6. The AND circuit 6 calculates a logical product of the inputted signals, and generates the delayed signal OUT. Therefore, the AND circuit 6 outputs the delayed signal OUT which rises in synchronization with the rising edge of the count signal D3 and falls in synchronization with the falling edge of the input signal IN (see t8-t9 in FIG. 2). In this manner, the delay circuit 100 can output the delayed signal OUT, the rising edge of which is delayed from the rising edge of the input signal IN (see t1-t8 in FIG. 2). Note that, all of the count signals D1-D3 does not necessarily need to be inputted to the AND circuit 6, but the count signal D3 alone may be inputted to the AND circuit 6.

Then, the delayed signal OUT is inputted to the falling one-shot circuit 7 within the reset signal output circuit 40. The output of the falling one-shot circuit rises in synchronization with the falling edge of the delayed signal OUT. The signal in "High" level outputted from the falling one-shot circuit is inputted to the OR circuit OR. Therefore, the OR circuit OR outputs the reset signal to each reset terminal RT of the DFF circuits DFF1-DFF3. The DFF circuits DFF1-DFF3 are reset based on the input of this reset signal. Furthermore, the reset signal can also be generated by the reset signal output circuit 40 by, for example, supplying "High" level signal at the reset signal input terminal RT.

As explained above, in this embodiment, the rising edge delay circuit 3 generates the signal OUT, the rising edge of which is delayed from the rising edge of the signal DIN which is generated based on the input of the input signal IN and the signal outputted from the NAND circuit 1. Then, the signal DSB which is generated in response to this signal DOUT is inputted to the flip-flop circuits within the counter 20 as the reference clock signal to control the operation of the counter 20. The flip-flop circuits output the count signals D1-D3 which will become "High" level states at the time when the signal DSB is inputted to the clock input terminals CKs as the reference clock. The delayed signal output circuit 30 can output the delayed signal OUT, the transition of which is delayed from the transition of the input signal IN, by calculating the logical product of this count signals D1-D3 and the input signal IN. That is, in this embodiment, a reference pulse train generated by the reference pulse generating circuit 10 containing the rising edge delay circuit 3 which determines a time interval between the reference pulses is inputted to the counter as the reference clock, so that the delay circuit 100 can output the delayed signal OUT, the transition of which is delayed from the transition of the input signal IN. Furthermore, by feeding back the signal DS generated by the rising one-shot circuit 4 to the feedback circuit 11, it can generate a delay time three times (the number of the flip-flop circuits) as large as the delay time of the single rising edge delay circuit 3. Furthermore, although the counter 20 is composed of three flip-flop circuits in this embodiment, the delay time can be further increased by increasing the number of the flip-flop circuits in other embodiments.

Furthermore, since the delay circuit 100 in accordance with this embodiment has a single rising edge delay circuit 3, the unit delay time, i.e., the delay time per rising edge delay circuit is unchanged. Therefore, it can reduce variations in the final delay time.

Figure 5:
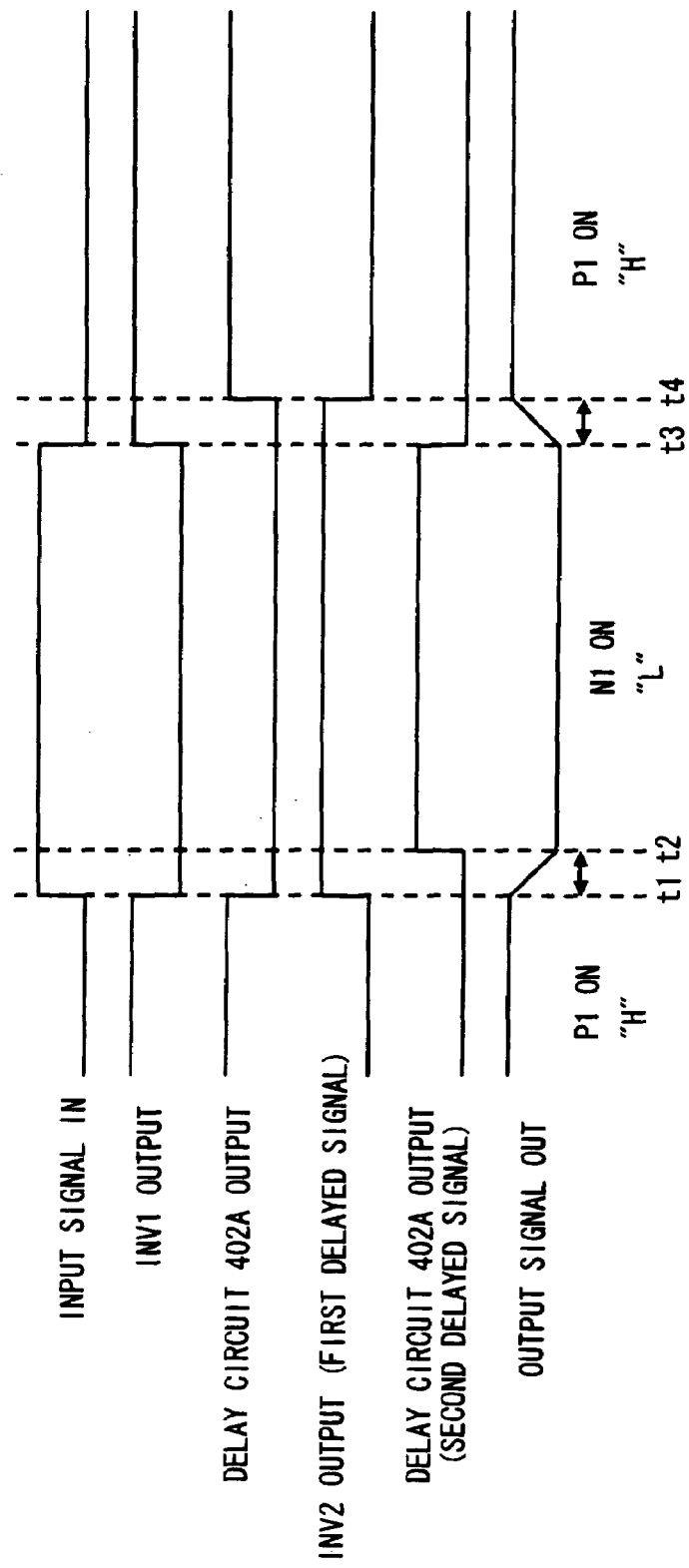
FIG. 5 is a timing chart showing waveforms at various points in the through current prevention circuit in related art.
Figure 6:
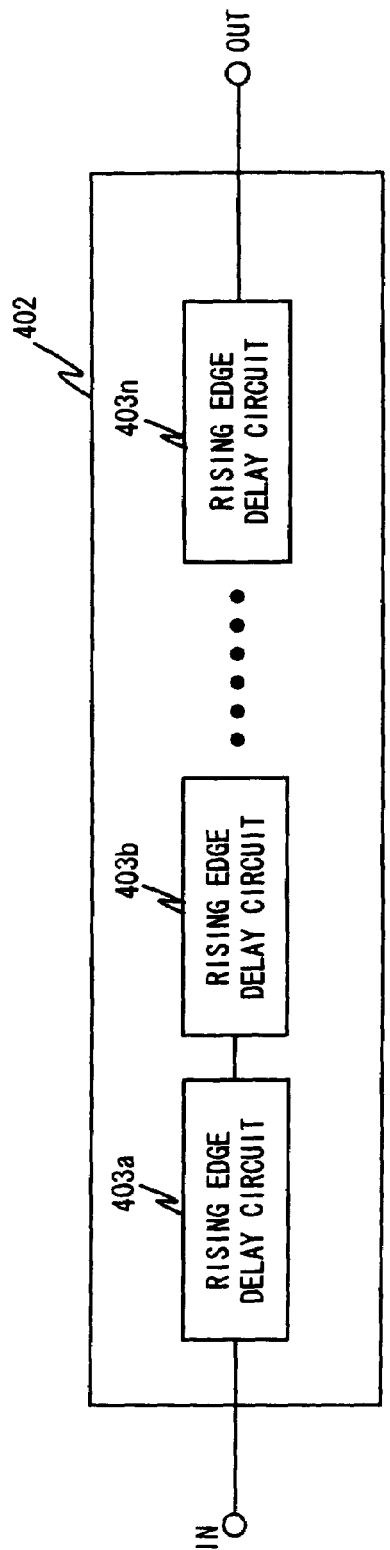
FIG. 6 shows internal structure of the delay circuit in related art.
Figure 7:
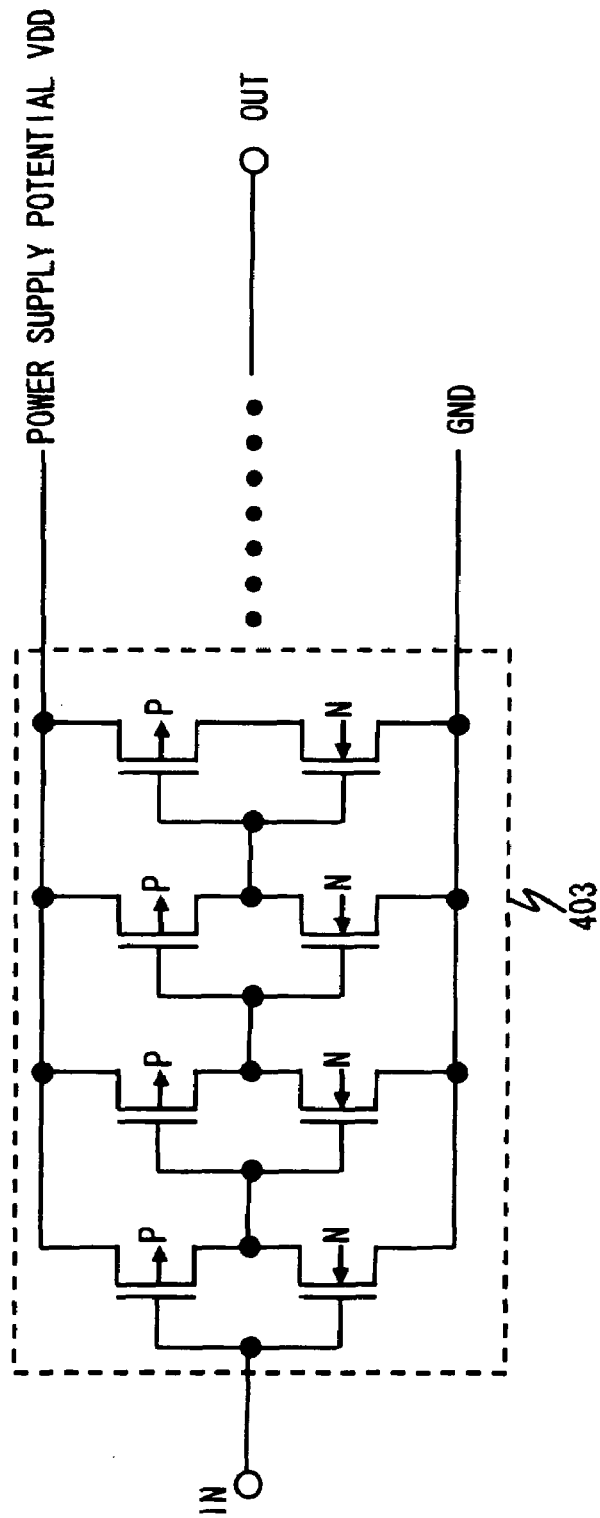
FIG. 7 shows internal structure of the rising edge delay circuits in the delay circuit in related art.

Furthermore, a delay circuit in the related art generates delay by connecting several rising edge delay circuits when large delay time is required. Therefore, it has required large layout area for the delay circuit, and thereby increasing the chip size in the related art. Meanwhile, the delay circuit 100 in accordance with this embodiment can generates a delay time several times as large as the delay time of one delay circuit with the single rising edge delay circuit 3. Consequently, it can reduce the layout area. Therefore, it can reduce the chip size. Furthermore, the delay circuit 100 in accordance with this embodiment can generate desired delay time (i.e., N times as large as the delay time of one delay circuit) with the single rising edge delay circuit. Consequently, it can certainly create the off-state between t1 to t2, or between t3 to t4 in the related art shown in FIG. 5. Accordingly, for example, when the delay circuit 100 is connected to CMOS transistors, it can certainly create the off-state during which both PMOS transistor and NMOS transistor are simultaneously the off-states. Therefore, it can certainly prevent current from flowing from power supply potential to ground potential, which may otherwise occur when both of the PMOS transistor and NMOS transistor become the on-state at the same time.

Figure 8:
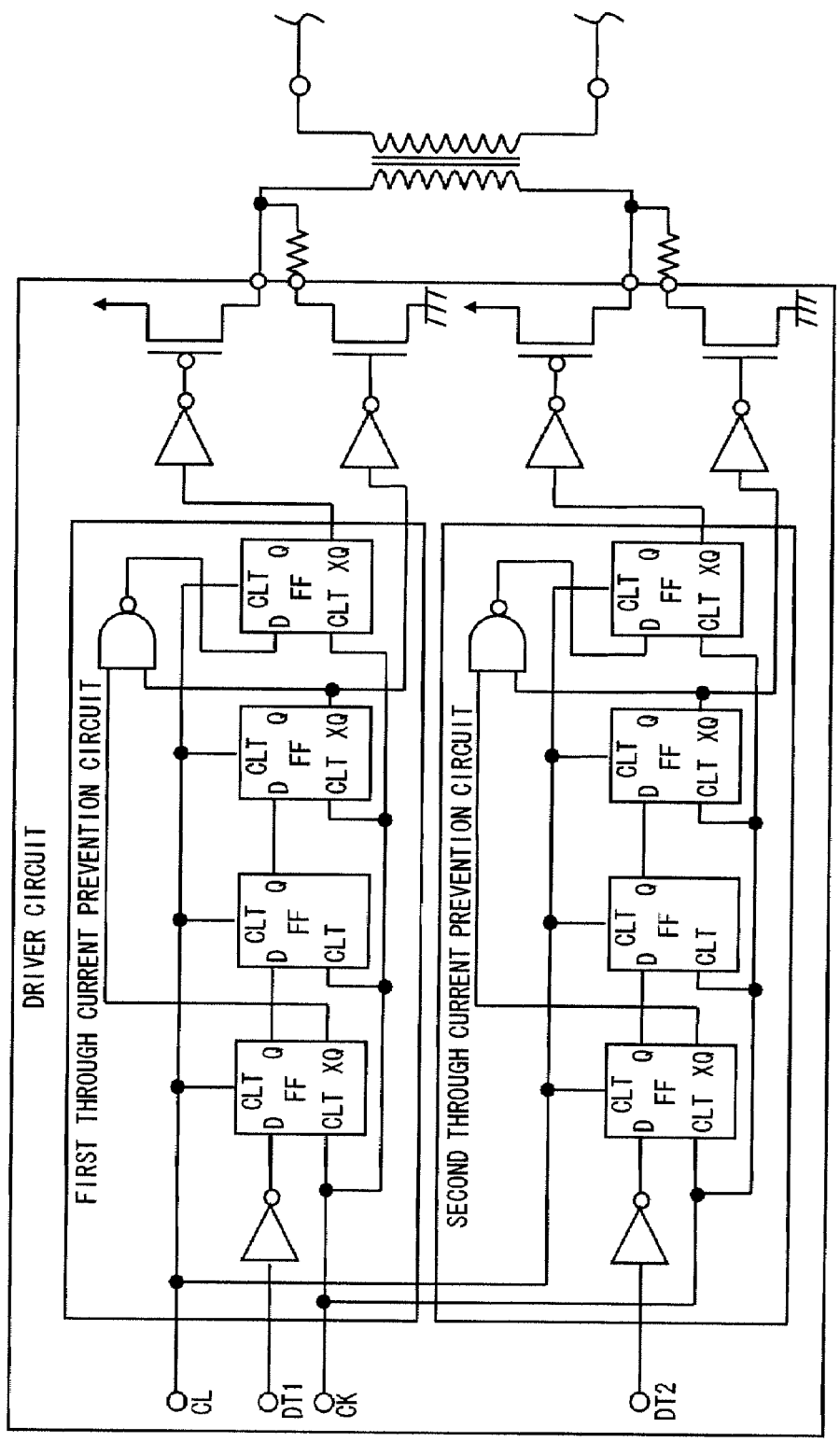
FIG. 8 is a block diagram showing a delay circuit in related art.

Furthermore, in the through current prevention circuit 80 in the related art shown in FIG. 8, it controls the operations of several flip-flops connected with one another based on a clock signal inputted to a clock input terminal CK (see FIG. 8). Therefore, the current prevention circuit 80 in the related art requires an external clock generating circuit to generate a clock signal inputted to the clock input terminal CK. Meanwhile, in this embodiment, the reference pulse train which is internally generated in response to the input signal IN is used as the reference clock. Therefore, the delay circuit 100 does not need any external clock signal, and therefore, it requires no external clock generating circuit.

Furthermore, the reset signal output circuit 40 forwards the reset signal, which is generated in synchronization with the falling edge of the delayed signal OUT outputted from the delayed signal output circuit 30, to each reset terminal of the DFF circuits. Therefore, it can reset the plurality of flip-flop circuits within the counter at the moment when the delayed signal OUT changes from the "High" level state to the "Low" level state. Furthermore, it is also possible to reset the DFF circuits by, for example, supplying "High" level signal to the reset signal input terminal RT.

Second Embodiment

Figure 3:
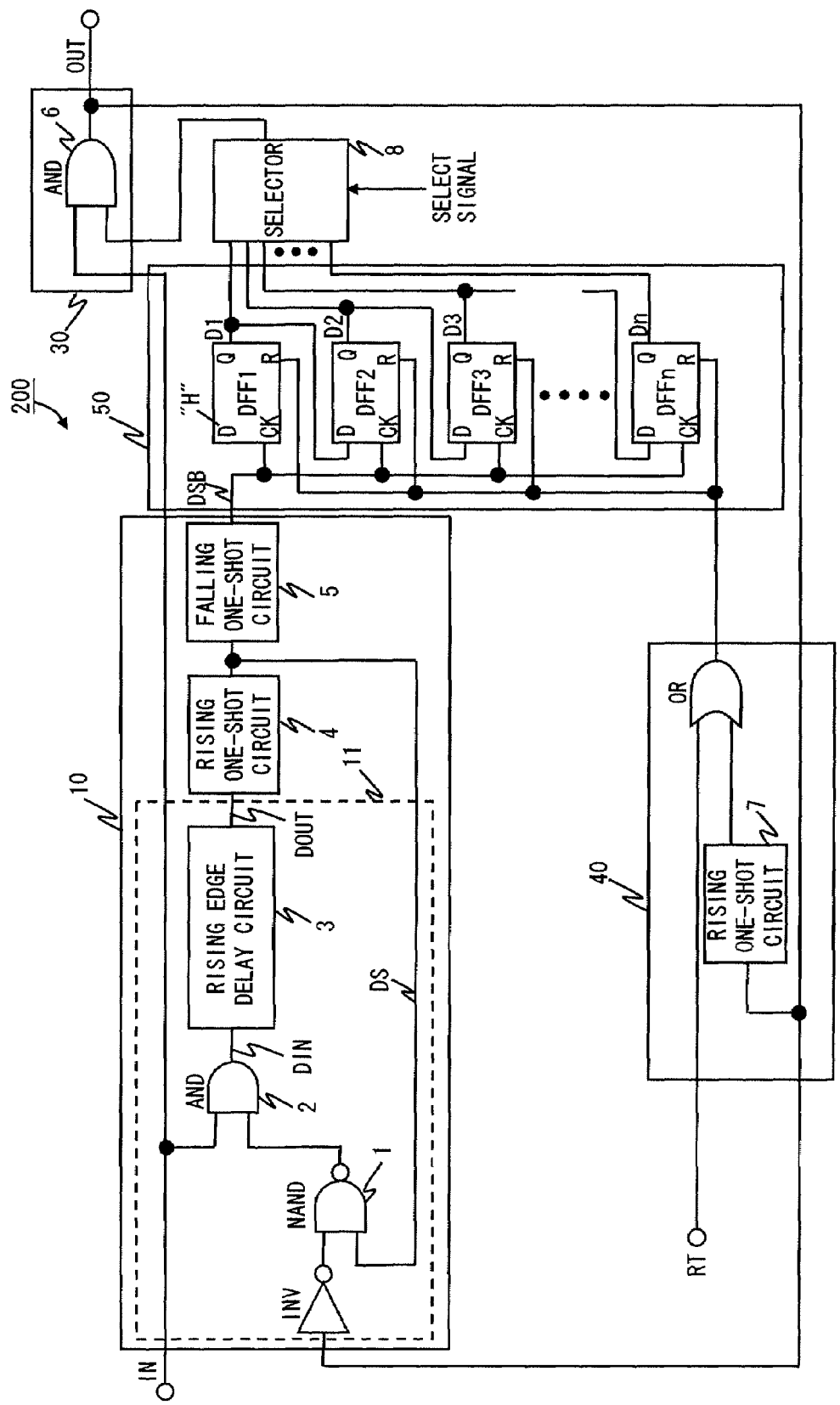
FIG. 3 is a block diagram showing a delay circuit in accordance with a second embodiment of the present invention.
Figure 4:
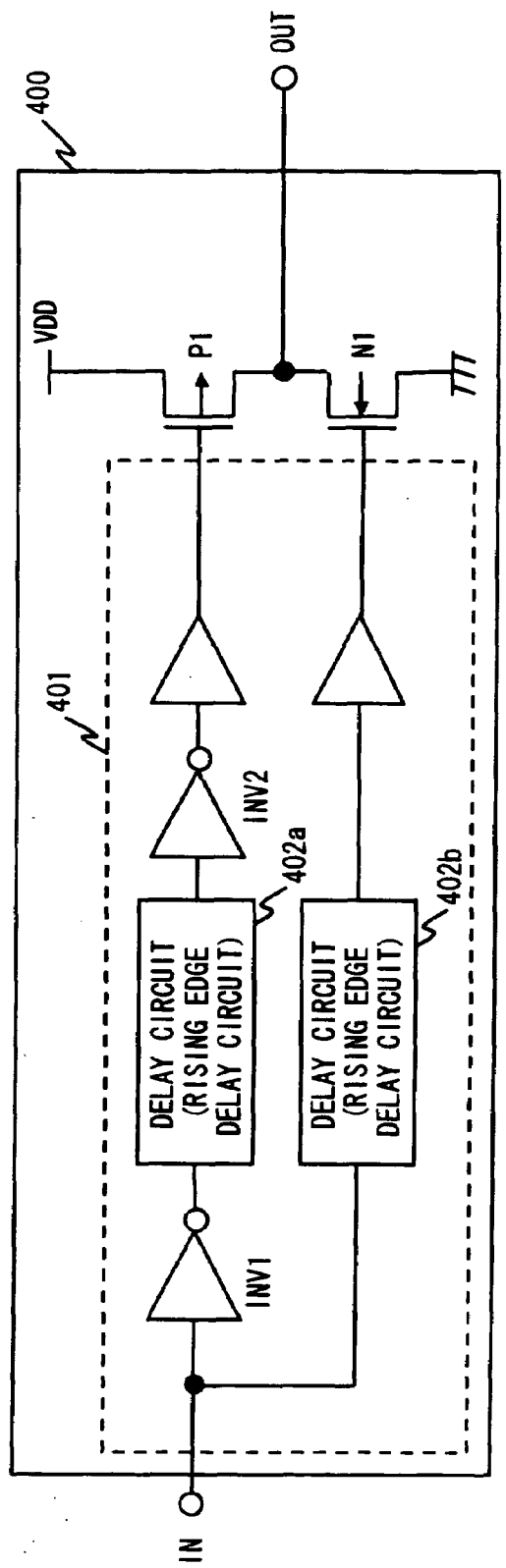
FIG. 4 is a block diagram showing a through current prevention circuit composed of delay circuits in related art.

FIG. 3 is a block diagram showing a delay circuit 200 in accordance with a second embodiment of the present invention. Incidentally, in FIG. 3, the same signs are assigned to components and structures common to those in FIG. 1, and their detailed explanation are omitted. In the first embodiment, the counter 20 is composed of the DFF circuits DFF1-DFF3. In contrast to that, the counter 50 is composed of a plurality of DFF circuits DFF1-DFFn (n is an integer larger than 1) in the delay circuit 200 of this embodiment. Furthermore, the delay circuit 200 includes a selector 8 connected between the counter 50, which correspond to the counter 20 in the delay circuit 100 of the first embodiment, and the delayed signal output circuit 30. Note that, the structure and operation of the delay circuit 200 in accordance with this embodiment are the same as the structure and operation of the delay circuit 100 in accordance with the first embodiment except for the structure and operation of the counter 50 and the newly added selector 8. Therefore, only the structure and operation of the counter 50 and the newly added selector 8 are explained hereinafter.

The counter 50 is composed of a plurality of DFF circuits DFF1-DFFn. The signal DSB generated by the falling one-shot circuit 5 is inputted to each of the DFF circuits DFF1-DFFn as the reference clock. A "High" level signal is continuously supplied to the input D of the DFF circuit DFF1. Furthermore, the output Q of the DFF circuit DFF1 is connected to the input D of the DFF circuit DFF2, and the output Q of the DFF circuit DFF2 is connected to the input D of the DFF circuit DFF3. Furthermore, the output Q of the DFF circuit DFF(n−1) is connected to the input D of the DFF circuit DFFn. Furthermore, count signals D1-Dn are outputted from respective outputs Qs of the DFF circuits DFF1-DFFn to the selector 8. Furthermore, the output of the reset signal output circuit 40 is connected to each reset R of the DFF circuits DFF1-DFFn.

The selector 8 receives the count signals D1-Dn outputted from the plurality of DFF circuits DFF1-DFFn. Furthermore, the selector 8 selects one count signal from the count signals D1-Dn, and outputs it to the delayed signal output circuit 30 based on a select signal supplied to the selector 8. In this manner, the delay circuit 200 can output the delayed signal OUT, the rising edge of which is delayed from the rising edge of the input signal IN.

As explained above, the selector 8 is provided between the counter 50 which is composed of a plurality of DFF circuits DFF1-DFFn and the delayed signal output circuit 30 in this embodiment. Then, the selector 8 selects one count signal from the count signals D1-Dn, and outputs it to the delayed signal output circuit 30 based on the select signal. Therefore, the delayed signal output circuit 30 can generates the delayed signal OUT by calculating the logical product of the input signal IN and the one count signal selected by the selector 8. That is, in the delay circuit 200 in accordance with this embodiment, the amount of delay time is selectable from 1 to n times as large as the original delay time, while using a single rising edge delay circuit.

Furthermore, since the delay circuit 200 can generate desired delay time based on the select signal supplied to the selector 8, it does not require design changes of the circuit, and has a high degree of flexibility in the design. Furthermore, the select signal may be externally established, for example, through a serial interface. Therefore, it allows the establishment of desired delay time from the outside of the device.

It is apparent that the present invention is not limited to the above embodiments, but maybe modified and changed without departing from the scope and spirit of the invention. For example, although the reference pulse train is generated from the rising edge delay circuit 3 in the embodiments, a falling edge delay circuit, the falling edge of which is delayed from the inputted signal DIN, can be used to generate the reference pulse train in other embodiments.

What is claimed is:

1. A delay circuit to generate and output a delayed signal delayed from an input signal comprising:
   a reference pulse generating circuit to generate a reference pulse train in response to the input of the input signal, the reference pulse generating circuit having a feedback circuit containing a delay portion to determine a time interval between the reference pulses;
   a counter to output count signals based on a reference clock, the counter receiving the reference pulse train generated by the reference pulse generating circuit as the reference clock; and
   a delayed signal output circuit to generate and output the delayed signal based on the input signal and the count signals.

2. The delay circuit according to claim 1, wherein the delay portion determines the time interval between the reference pulses based on the delay amount in the signal outputted by the delay portion from the signal inputted to the delay portion.

3. The delay circuit according to claim 1, wherein the delay portion generates a delay pulse train used to generate the reference pulse train; and
   the feedback circuit further includes a calculation circuit to output the logical product of a signal generated based on the delayed signal and the delay pulse train, and the input signal to the delay portion.

4. The delay circuit according to claim 2, wherein the delay portion generates a delay pulse train used to generate the reference pulse train; and the feedback circuit further includes a calculation circuit to output the logical product a signal generated based on the delayed signal and the delay pulse train, and the input signal to the delay portion.

5. The delay circuit according to claim 3, wherein the delay portion causes the calculation circuit to generate an input pulse train having the time interval by feeding back the delayed pulse delayed from the signal inputted from the calculation circuit by the time interval to the calculation circuit, and outputs the delayed pulse train delayed from the input pulse train.

6. The delay circuit according to claim 1, wherein the counter has a plurality of flip-flop circuits to generate the count signals, each of the count signals being composed of a first logical value and a second logical value different from the first logical value; and the plurality of flip-flop circuits outputs the count signals to the delayed signal output circuit, the count signals being changed from the first logical value to the second logical value with different timings from each other upon the input of the reference pulse train.

7. The delay circuit according to claim 2, wherein the counter has a plurality of flip-flop circuits to generate the count signals, each of the count signals being composed of a first logical value and a second logical value different from the first logical value; and the plurality of flip-flop circuits outputs the count signals to the delayed signal output circuit, the count signals being changed from the first logical value to the second logical value with different timings from each other upon the input of the reference pulse train.

8. The delay circuit according to claim 3, wherein the counter has a plurality of flip-flop circuits to generate the count signals, each of the count signals being composed of a first logical value and a second logical value different from the first logical value; and the plurality of flip-flop circuits outputs the count signals to the delayed signal output circuit, the count signals being changed from the first logical value to the second logical value with different timings from each other upon the input of the reference pulse train.

9. The delay circuit according to claim 4, wherein the counter has a plurality of flip-flop circuits to generate the count signals, each of the count signals being composed of a first logical value and a second logical value different from the first logical value; and the plurality of flip-flop circuits outputs the count signals to the delayed signal output circuit, the count signals being changed from the first logical value to the second logical value with different timings from each other upon the input of the reference pulse train.

10. The delay circuit according to claim 1, wherein the delayed signal output circuit generates the delayed signal based on the logical product of the input signal and the count signals.

11. The delay circuit according to claim 2, wherein the delayed signal output circuit generates the delayed signal based on the logical product of the input signal and the count signals.

12. The delay circuit according to claim 3, wherein the delayed signal output circuit generates the delayed signal based on the logical product of the input signal and the count signals.

13. The delay circuit according to claim 1, further comprising a reset signal output circuit to generate a reset signal based on the delayed signal, and output the generated reset signal to the counter.

14. The delay circuit according to claim 2, further comprising a reset signal output circuit to generate a reset signal based on the delayed signal, and output the generated reset signal to the counter.

15. The delay circuit according to claim 3, further comprising a reset signal output circuit to generate a reset signal based on the delayed signal, and output the generated reset signal to the counter.

16. The delay circuit according to claim 4, further comprising a reset signal output circuit to generate a reset signal based on the delayed signal, and output the generated reset signal to the counter.

17. The delay circuit according to claim 1, further comprising a selector to select one count signal from the plurality of count signals outputted from the counter, and output the selected count signal to the delayed signal output circuit based on a select signal.

18. The delay circuit according to claim 2, further comprising a selector to select one count signal from the plurality of count signals outputted from the counter, and output the selected count signal to the delayed signal output circuit based on a select signal.

19. The delay circuit according to claim 3, further comprising a selector to select one count signal from the plurality of count signals outputted from the counter, and output the selected count signal to the delayed signal output circuit based on a select signal.

20. The delay circuit according to claim 4, further comprising a selector to select one count signal from the plurality of count signals outputted from the counter, and output the selected count signal to the delayed signal output circuit based on a select signal.

* * * * *